(12) United States Patent
Kinoshita et al.

(10) Patent No.: US 6,376,364 B1
(45) Date of Patent: Apr. 23, 2002

(54) METHOD OF FABRICATING SEMICONDUCTOR DEVICE

(75) Inventors: Takao Kinoshita, Kasaoka; Masato Kobayashi, Kawasaki, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/448,494

(22) Filed: Nov. 24, 1999

(30) Foreign Application Priority Data

Nov. 26, 1998 (JP) .......................... 10-335100

(51) Int. Cl.⁷ .......................... H01L 21/4763
(52) U.S. Cl. .................. 438/637; 438/687; 438/700; 438/754; 438/906; 438/725
(58) Field of Search ................ 438/637, 660, 438/687, 700, 754, 906, 745, FOR 347, FOR 355, 725

(56) References Cited

U.S. PATENT DOCUMENTS 5,926,709 A * 7/1999 Aisou et al.
6,028,015 A * 2/2000 Wang et al.
6,136,708 A * 10/2000 Aoki
6,147,002 A * 11/2000 Kneer
6,172,386 B1 * 1/2001 Jung et al.

FOREIGN PATENT DOCUMENTS

JP 1-188856 A 7/1989
JP 6-69203 A 3/1994

* cited by examiner

Primary Examiner—George Fourson
Assistant Examiner—Michelle Estrada
(74) Attorney, Agent, or Firm—Nixon & Vanderhye

(57) ABSTRACT

A method of fabricating a semiconductor device first involves forming a conductive layer made of copper or its alloy as a principal component on a semiconductor substrate. Then, forming an insulating layer on the conductive layer. Next, forming an opening in the insulating layer with use of a resist pattern as a mask so as to reach the conductive layer; subjecting the resulting semiconductor substrate to an oxidizing/ashing treatment in an oxygen plasma atmosphere to remove the resist pattern and to oxidize at least an inner surface of the opening and finally, washing at least the inner surface of the opening with a solution containing citric acid as a principal component at normal temperature.

3 Claims, 6 Drawing Sheets

METHOD OF FABRICATING SEMICONDUCTOR DEVICE

BACKGROUND OF THE INVENTION

1. Field of the Invention

This invention relates to a method of fabricating a semiconductor device. More particularly, this invention relates to a method of fabricating a semiconductor device which comprises the step of forming a conductive layer made of copper or a copper alloy as a principal component.

2. Description of the Related Art

As the integration density and operational speed of LSI semiconductor devices have increased, miniaturization and multi-layered wiring structures in LSI semiconductor devices have also increased. However, the miniaturization of wiring results in increased wiring resistance and a drop in reliability. Consequently, Cu material having low resistance and a high melting point must be used in place of Al alloys that have been used in the past.

A semiconductor device fabrication method according to the prior art, that includes a Cu wiring step, is shown in FIGS. 2(a) to 2(g).

As shown in FIG. 2(a), transistors and capacitors are fabricated by first forming device isolation regions ($SiO_2$ film) 1 and gate electrodes 3 on a silicon (Si) substrate 23 having diffusion layers (source/drain) 2 or the like by a conventional photolithography, a conventional dry etching and a conventional CVD method, and implanting various ions. Thereafter, a BPSG film 5 is deposited by a CVD method, and flattening is conducted by a CMP method. Contact holes 4 are bored by a photolithography and dry etching process with a photoresist 6 as a mask. Incidentally, in FIG. 2(a), the surface of the gate electrodes 3 and the surface of the diffusion layers 2 are silicidized to form suicide layers 3a and 2a, respectively, in order to lower the resistance. Reference numeral 2b represents a low concentration diffusion layer for preventing a short-channel effect, and reference numeral 3b represents a side wall.

Next, as shown in FIG. 2(b), a TiN/Ti laminate film 7 is deposited by a sputtering in each contact hole 4. A tungsten (W) film 8 is then deposited by a CVD method. Then, flattening is carried out by a CMP method so that the TiN/Ti laminate film 7 and the W film 8 remains only in each contact hole and thereby W plugs are formed.

As shown in FIG. 2(c), a PE-$SiO_2$ film 9 is deposited by a CVD method on the W plugs and BPSG film 5, and contact holes 10 for wiring are formed on the W plugs by a photolithography and dry etching process.

As shown in FIG. 2(d), a barrier metal 11 made of metal such as Ti, TiN, Ta, TaN or WN is deposited onto the W plugs by a reactive sputtering or CVD method, and a Cu film 12 is deposited further by sputtering, CVD or ECD method. Flattening is carried our by a CMP method so as to leave the barrier metal 11 and the Cu film 12 only in each contact hole for wiring, and thereby a Cu wiring in a first tier is formed.

Next, as shown in FIG. 2(e), a SiN film 13 and a $SiO_2$ film 14 are serially deposited on the Cu wiring 12 in the first tier, and grooves 15 for wiring in a second tier are formed by a photolithography and dry etching process. Via-holes 17 are then opened with a photoresist 16 as a mask by a dry etching process using a fluorine-containing gas. The order of the two operations, i.e., the opening of the via-holes and the formation of the grooves for wiring, may be reversed. Incidentally, since Cu has a low vapor pressure, Cu reacts with the gas used for the dry etching during the formation process of the via-holes. In consequence, a copper-containing deposit 19 formed as the reaction product adheres to a side wall portion and an upper portion of the via-holes. Also, fluorine (F) used for the dry etching penetrates into the bottom of the via-holes, and the surface of the Cu wiring 12 in the first tier changes to a high resistance layer 18 (a high resistance layer comprising a mixture of Cu and F).

As shown in FIG. 2(f), a subsequent resist ashing process removes the photoresist and the copper-containing deposits adhering to the side wall portion of the via-hole. The ashing conditions (in the case of a resist film thickness of 1,000 nm) at this time are as follows:

$O_2$: 300 sccm, pressure: 1 Torr, microwave output: 1,400 W, temperature: 200° C., time: 60 to 90 seconds.

In consequence, the copper-containing deposits on the via-hole side wall and the high resistance layer at the via-hole bottom are converted to F-containing Cu oxides ($CuO_2$ or $CuO$) 20 by plasma of the heated oxygen employed in the ashing process. The Cu oxides are thereafter removed by heat-treatment at 200 to 500° C. for one minute to one hour under a low pressure $H_2$ atmosphere. Alternatively, the surface of the Cu wiring in the first tier is oxidized beforehand, and during removal of the resist, this Cu oxide film is removed from the bottom of the via-holes by incessantly circulating a solution containing citric acid (trade name "Shumma 200K", product of Osaka Sasaki Kagaku, Japan) heated to 60 to 90° C. As for the via-hole bottom, oxidation of Cu is reduced to a minimum by a treatment to strip off the resist using the oxygen plasma while cooling the substrate or by a treatment to strip the resist using an organic resist stripper.

Ar sputter/etching is conducted as a pre-treatment for depositing a barrier metal so as to remove an insulating layer of CuO or the like which has formed at the bottom of the via-hole. A barrier metal 21 is deposited by a sputtering or CVD method in the via-holes formed on the Cu wiring in the first tier and in the grooves for wiring in the second tier, as shown in FIG. 2(g). Subsequently, a Cu film 22 is deposited by a sputtering, CVD or ECD method. Then, flattening is carried our by a CMP method so as to leave the barrier metal and the Cu film only in the via-holes and the grooves, thereby forming a Cu wiring in the second tier.

Thereafter, the process steps of FIGS. 2(e) to 2(g) are repeated to form multi-layered wiring using Cu as a wiring material.

When Cu is used as the wiring material of the semiconductor device as described above, Cu is exposed to the dry etching gas and to the ashing treatment for removing the resist during the fabrication process, and thereby forms fluorine-containing copper oxide. Though this oxide is removed by the heat-treatment in the $H_2$ atmosphere or by the treatment using the citric acid solution under the heated state, Cu is denatured by the high temperature heat-treatment, and its reliability as a wiring material drops.

When the oxide film is formed in advance on the surface of the Cu wiring in the first tier before the formation of the via-holes as described above, control of the thickness of the oxide film is difficult.

Under the related art resist ashing conditions, the deposits cannot be oxidized completely and thus cannot be removed completely with citric acid. The thickness of the resulting Cu oxide film can be decreased by the oxygen plasma treatment while the substrate is cooled, or by the organic resist stripper treatment. However, even when such a process is conducted, the Cu-containing deposits on the side wall and upper portions of the via-holes and the high resistance layer at the hole bottom cannot be removed. The insulating layer, such as CuO formed at the bottom of the via-holes, is removed by conducting Ar sputtering/etching before the formation of the barrier metal in order to obtain a low and stable resistance value in the via-holes. The treatment must be continued for a long time unless the Cu surface oxide layer is removed completely in the preceding step. When Cu remains in an inter-layer insulating film, the problem of a drop in the break down voltage of the insulating film occurs.

SUMMARY OF THE INVENTION

It is an object of the present invention to provide a method of fabricating a semiconductor device that can perfectly clean the surface of Cu wiring and can perfectly remove unnecessary deposits.

In accordance with one aspect of the present invention, there is provided a method of fabricating a semiconductor device comprising the steps of: forming a conductive layer made of copper or its alloy as a principal component on a semiconductor substrate; forming an insulating layer on the conductive layer; forming an opening in the insulating layer with use of a resist pattern as a mask so as to reach the conductive layer; subjecting the resulting semiconductor substrate to an oxidizing! ashing treatment in an oxygen plasma atmosphere to remove the resist pattern and to oxidize at least an inner surface of the opening; and washing at least the inner surface of the opening with a solution containing citric acid as a principal component at normal temperature.

In accordance with another aspect of the present invention, there is provided a method of fabricating a semiconductor device comprising the steps of: forming a conductive layer made of copper or its alloy as a principal component on a semiconductor substrate; forming an insulating layer on the conductive layer; forming an opening in the insulating layer with use of a resist pattern as a mask so as to reach the conductive layer; subjecting the resulting semiconductor substrate to an oxidizing/ ashing treatment in an oxygen plasma atmosphere to remove the resist pattern and to oxidize at least an inner surface of the opening; and washing at least the inner surface of the opening with a solution containing citric acid as a principal component at normal temperature.

DESCRIPTION OF THE PREFERRED EMBODIMENTS

Figure 1A:
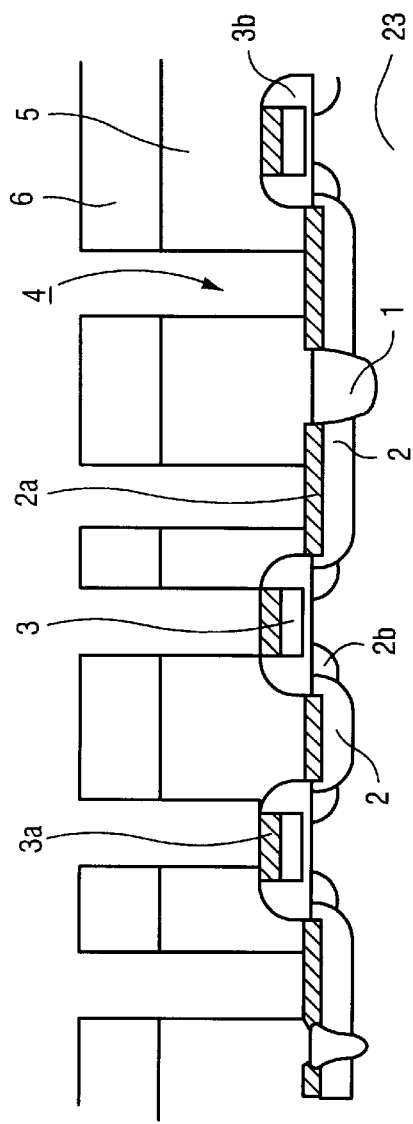
FIGS. 1(a) to 1(h) are each a schematic sectional view showing important steps in one method of fabricating a semiconductor device according to an embodiment of the present invention.

A method of fabricating a semiconductor device according to the present invention comprises the formation of a conductive layer made of copper or its alloy as its principal component on a semiconductor substrate.

The semiconductor substrate in the present invention is not limited, in particular. It may be, for instance, a substrate of an element semiconductor such as Si or Ge, or a substrate of a compound semiconductor such as GaAs or ZnSe. Among the above named possibilities, a silicon substrate is most preferred. Discrete devices such as transistors, resistors, capacitors, etc, or circuits comprising their combinations may be formed on the surface of the semiconductor substrate. Furthermore, interlayer insulating films, contact plugs, wiring layers, etc, may be formed in combination. Therefore, the conductive layer may be formed directly on the semiconductor substrate, or may be formed over the semiconductor substrate after the devices, circuits, interlayer insulating films, etc, are formed.

The alloy that constitutes the conductive layer and is made of copper as the principal component is a Cu alloy with at least one metal such as Al, Ti, Ta and the like. The proportion of copper in the alloys may be such that the characteristics inherent to copper, such as resistivity, conductivity, melting point and the like, are not remarkably deteriorated. The proportion of Cu is, for example, at least about 30%, preferably at least about 50%.

The conductive layer is formed on or over the entire surface of the semiconductor substrate and may then be processed into a predetermined shape by a conventional patterning method. Alternatively, it is possible to form the conductive layer on an insulating film in which trenches having a desired pattern are formed, and then to flatten the conductive layer, thereby filling it into the trenches.

Next, the insulating layer is formed on the conductive layer, and openings are then formed in this insulating layer with a resist pattern as a mask so as to reach the conductive layer. The insulating layer is not limited, in particular, and examples thereof include a SiN film, a $SiO_2$ film or their laminate film.

The openings formed in the insulating layer must reach the conductive layer. In other words, the depth of the openings corresponds to the thickness of the insulating film.

The openings are preferably formed in such a size as to provide a suitable resistance value when a conductive material is filled into the openings. Trench-like openings not reaching the conductive layer (grooves) may be further formed in the insulating film. The openings can be formed by conventional photolithography using a resist material and an etching process using a fluorine type gas as an etching gas. Incidentally, when the opening is formed, a copper-containing substance may be unintendedly formed on an inner surface of opening, e.g., on a side wall (as a copper-containing deposits) and the bottom of the opening (as a copper-containing high resistance layer).

The resulting semiconductor substrate is subjected to oxidization/ashing in an oxygen plasma atmosphere so that at least an inner surface of the opening can be oxidized and the resist pattern can be completely removed from above the insulating film. Thus, the copper-containing substance (deposits and high resistance layer) unintendedly formed on the side wall and the bottom of the openings can be oxidized to oxides.

The term "oxygen plasma atmosphere" means an atmosphere in which active oxygen atoms are generated due to the electron impact dissociation of the plasma, and this atmosphere can have the oxygen concentration used generally for resist ashing as one of its examples. An example is the atmosphere in which oxygen is supplied at an oxygen flow rate of 100 to 500 sccm under a vacuum, at microwave power of 1,000 to 2,000 W and a temperature of 180 to 300° C. The oxidation/ashing time in this instance can be adjusted appropriately in accordance with the thickness of the resist pattern and with the depth and size of the openings. The time is from 2 to 10 minutes, for example. The term "copper-containing deposits" formed on the side wall of the openings means the reaction products formed by the reaction of the etching gas and the surface of the conductive layer during the formation of the openings that reach the conductive layer. The reaction products turn into the deposits containing copper, that constitutes the conductive layer, and deposit to the inner surface (on the side wall) of the openings. The term "copper-containing high resistance layer" means the high resistance layer that is formed on the surface of the conductive layer (i.e., the bottom of the openings) as a part of the etching gas (e.g., F) is implanted to the surface of the conductive layer.

At least the inner surface of the opening formed in the insulating layer is washed with a solution containing citric acid as the principal component at normal temperature, thereby the resulting oxides are removed. The term "solution containing of citric acid as the principal component" means an aqueous solution of citric acid, and an alkali metal salt or an alkaline earth metal salt of citric acid. The concentration of citric acid in this case is from about 5 to about 35 wt %. Hydrochloric acid, sulfuric acid, phosphoric acid or the like, may be added to this solution in the order of a few ppm. The temperature of this solution is normal temperature, that is from about 20 to about 30° C. In order to wash the inner surface of the opening, this solution is sprayed or applied to the surface of the resulting semiconductor substrate. Alternatively, the semiconductor substrate is exposed to a flowing stream of this solution or simply immersed into the solution. The immersion time can be adjusted appropriately in accordance with the citric acid concentration of the solution.

In fabricating a semiconductor device according to the present invention, it is possible to employ a process in place of the ashing treatment described above, which process removes the resist pattern and heat-treats the resulting semiconductor substrate in an oxygen atmosphere to oxidize at least an inner surface of the opening. Thus, the copper-containing deposits and the copper-containing high resistance layer formed on the side walls and the bottom of the openings are oxidized.

Conventional methods can be used as the method of removing the resist pattern such as the related art ashing method, a method that uses sulfuric acid and the like. In this way, the copper-containing deposits and the copper-containing high resistance layer formed on the side wall and the bottom of the openings can be completely oxidized in the same way as described above.

Hereinafter, the method of fabricating a semiconductor device according an embodiment of the present invention will be explained in detail with reference to the accompanying drawings.

As shown in FIG. 1(a), transistors and capacitors are first fabricated by forming device isolation regions ($SiO_2$ film) 1 and gate electrodes 3 on a silicon (Si) substrate 23 having diffusion layers (source/drain) 2 or the like by a conventional photolithography, a conventional dry etching and a conventional CVD method, and implanting various ions. Thereafter, a BPSG film 5 is deposited by a CVD method, and flattening is conducted by a CMP method. Contact holes 4 are bored by a photolithography and dry etching process with a photoresist 6 as a mask. Incidentally, in FIG. 1 (a), the surface of the gate electrodes 3 and the surface of the diffusion layers 2 are silicidized to form silicide layers 3a and 2a, respectively, in order to lower the resistance. Reference numeral 2b represents a low concentration diffusion layer for preventing a short-channel effect, and reference numeral 3b represents a side wall.

Figure 1B:
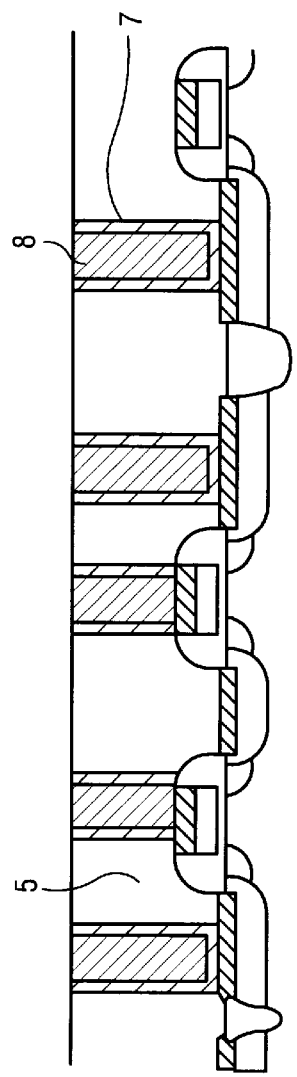

Next, as shown in FIG. 1(b), a TiN/Ti laminate film 7 is deposited by a sputtering in each contact hole 4. A tungsten (W) film 8 is then deposited by a CVD method. Then, flattening is carried out by a CMP method so that the TiN/Ti laminate film 7 and the W film 8 remains only in each contact hole 4 and thereby W plugs are formed.

Figure 1C:
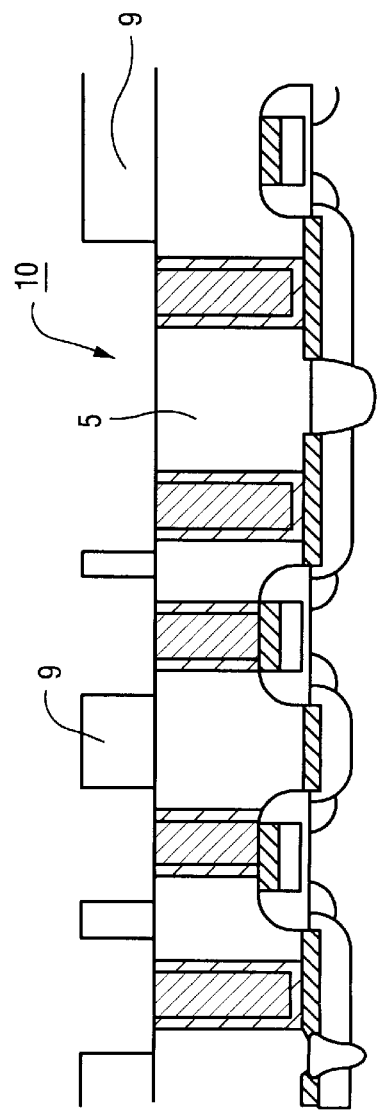

As shown in FIG. 1(c), a PE-$SiO_2$ film 9 is deposited by a CVD method on the W plugs and BPSG film 5, and contact holes 10 for wiring are formed on the W plugs by a photolithography and dry etching process.

Figure 1D:
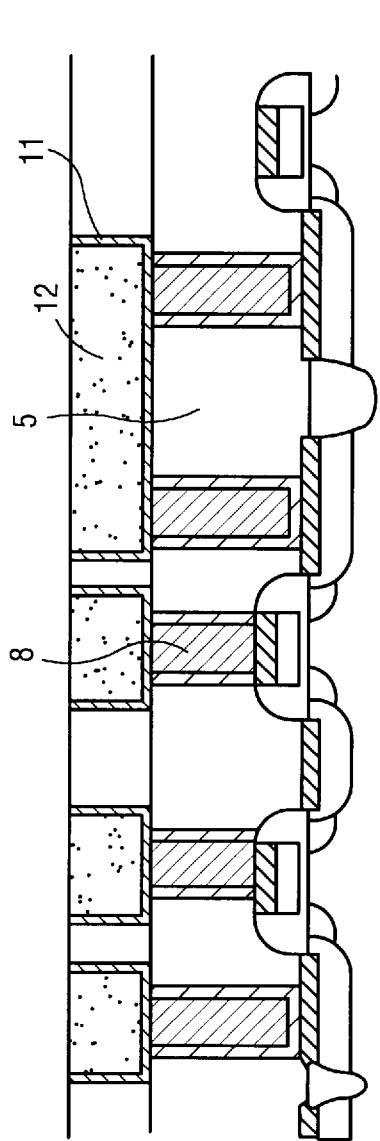

As shown in FIG. 1(d), a barrier metal 11 made of a metal such as Ti, TiN, Ta, TaN, or Wn is deposited on the W plugs by a reactive sputtering or CVD method, and a Cu film 12 is deposited further by sputtering, CVD or ECD method. Flattening is carried out by a CMP method so as to leave the barrier metal 11 and the Cu film 12 only in each contact hole 10 for wiring, and thereby a Cu wiring in a first tier is formed.

Figure 1E:
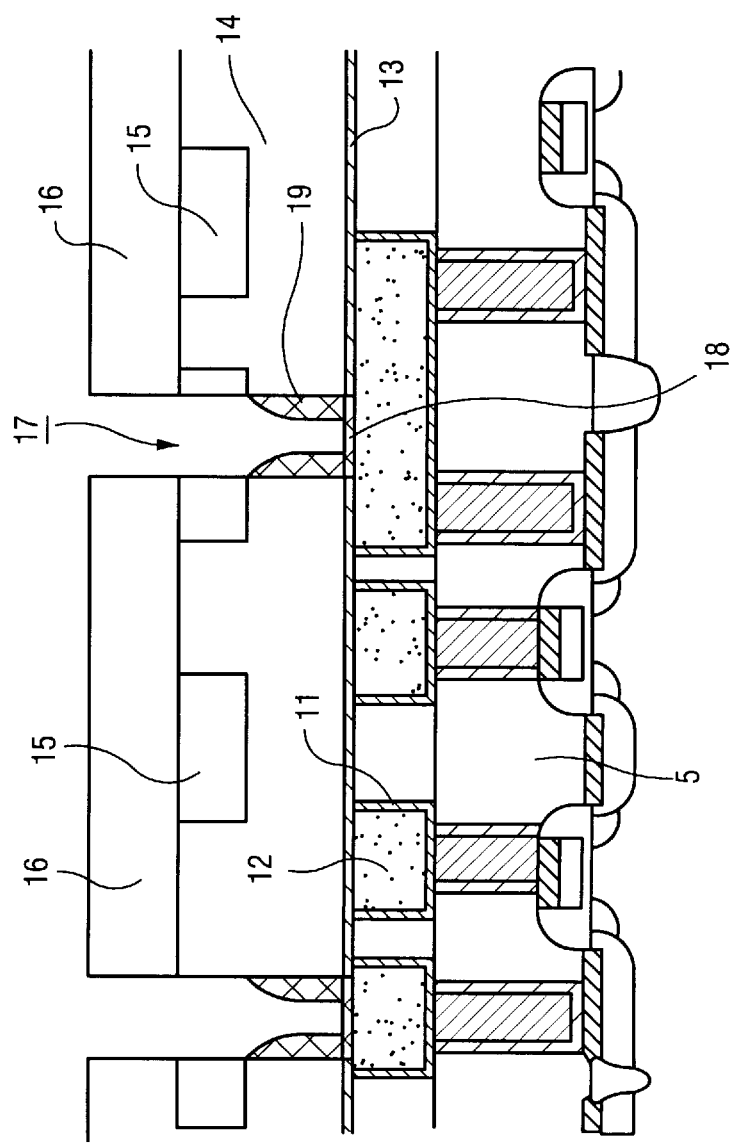

Next, as shown in FIG. 1(e), a SiN film 13 and a $SiO_2$ film 14 are serially deposited on the Cu wiring 12 in the first tier and the PE-$SiO_2$ film 9, and grooves 15 for wiring in a second tier are formed by a photolithography and dry etching process. Via-holes 17 are then opened with a photoresist 16 as a mask by a dry etching using a fluorine-containing gas. The order of the two operations, i.e., the opening of the via-holes and the formation of the grooves for wiring, may be reversed. Incidentally, since Cu has a low vapor pressure, Cu reacts with the gas used for the dry etching during the formation process of the via-holes. In consequence, a copper-containing deposit 19 formed as the reaction product adheres to a side wall portion and an upper portion of the via-holes. Also, fluorine (F) used for the dry etching penetrate into the bottom of the via-holes, and the surface of the Cu wiring 12 in the first tier changes to a high resistance layer 18 (a high resistance layer comprising a mixture of Cu and F).

Figure 1F:
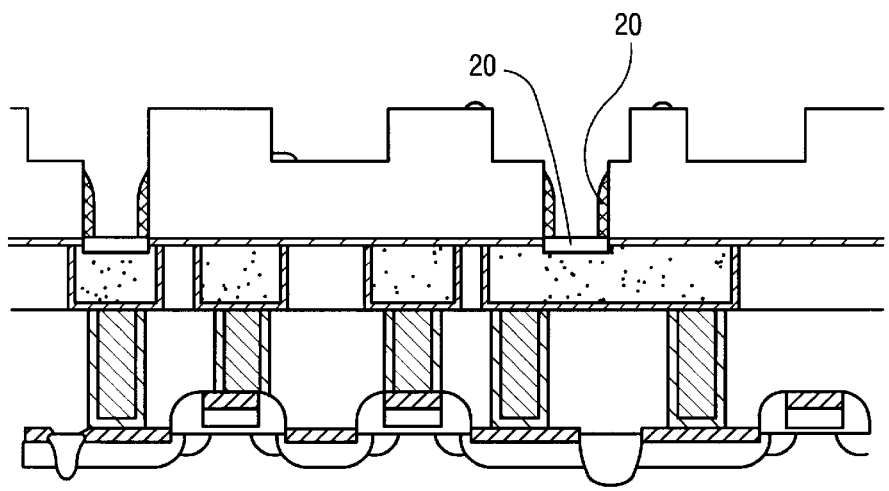

The via-holes and the grooves for wiring are formed as shown in FIG. 1(f), and then, oxidation/ashing is conducted in the oxygen plasma atmosphere in order to remove the photoresist and to completely oxidize the copper-containing deposits and the high resistance layer formed on the inner surface of the opening (on the side walls and the bottom of the openings). Reference numeral 20 in FIG. 1(f) denotes the resulting oxides.

The oxidation/ashing conditions at this time (at a resist film thickness of 1,000 nm) are as follows.

Oxidation/ashing condition:

$O_2$: 300 sccm

Pressure: 1 Torr

Microwave output: 1,400 W

Temperature: 200° C.

Time: longer than 120 seconds

Incidentally, the oxidation rate may be increased in this case by raising the substrate temperature to about 250° C.

Figure 1G:
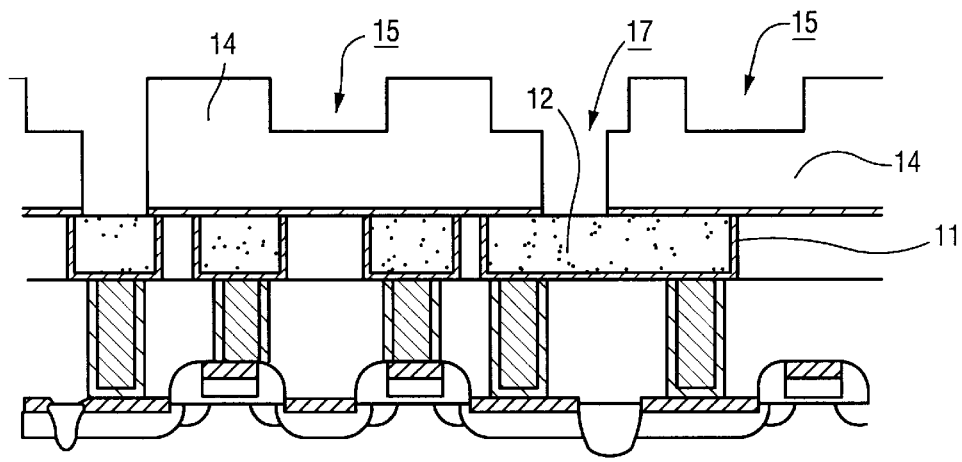

Thereafter, the resulting semiconductor substrate is washed with a solution containing citric acid as the principal component at normal temperature. For example, a solution containing 30 to 32% of citric acid ($C_6H_8O_7$) as a citric hydrate and containing several ppm of $SO_4$, Cl and $PO_4$ is diluted to 10% with pure water. After the solution is stabilized at a temperature of 20 to 30° C., the treatment is carried out. As a result, the oxide 20 is completely removed as shown in FIG. 1(g).

The copper-containing deposits formed on the side walls and the upper portion of the openings and the high resistance layer formed at the bottom are completely oxidized by oxidation/ashing, and are completely removed by the solution containing citric acid as the principal component. Therefore, the copper-containing deposits formed on the side walls and the upper portion of the openings can be completely removed, and the surface of the Cu wiring can be completely cleaned as well.

Incidentally, the following process steps can be used in place of the oxidation/ashing step described above.

The photoresist is removed by a conventional method. For example, the resist is removed according to the conditions of the related art resist ashing method or by using sulfuric acid. The heat-treatment is then carried out in an oxygen atmosphere to completely oxidize the copper-containing deposits and other substances. For example, the heat-treatment is carried out at not lower than 300° C. for at least 10 minutes. Thereafter, the oxide is completely removed by the solution containing citric acid as the principal component at normal temperature.

Figure 1H:
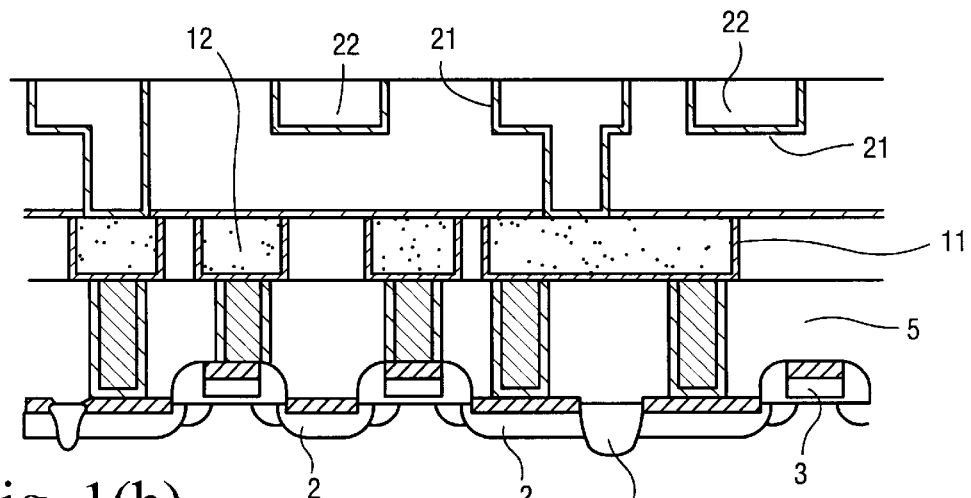
Figures 2A, 2B, 2C:
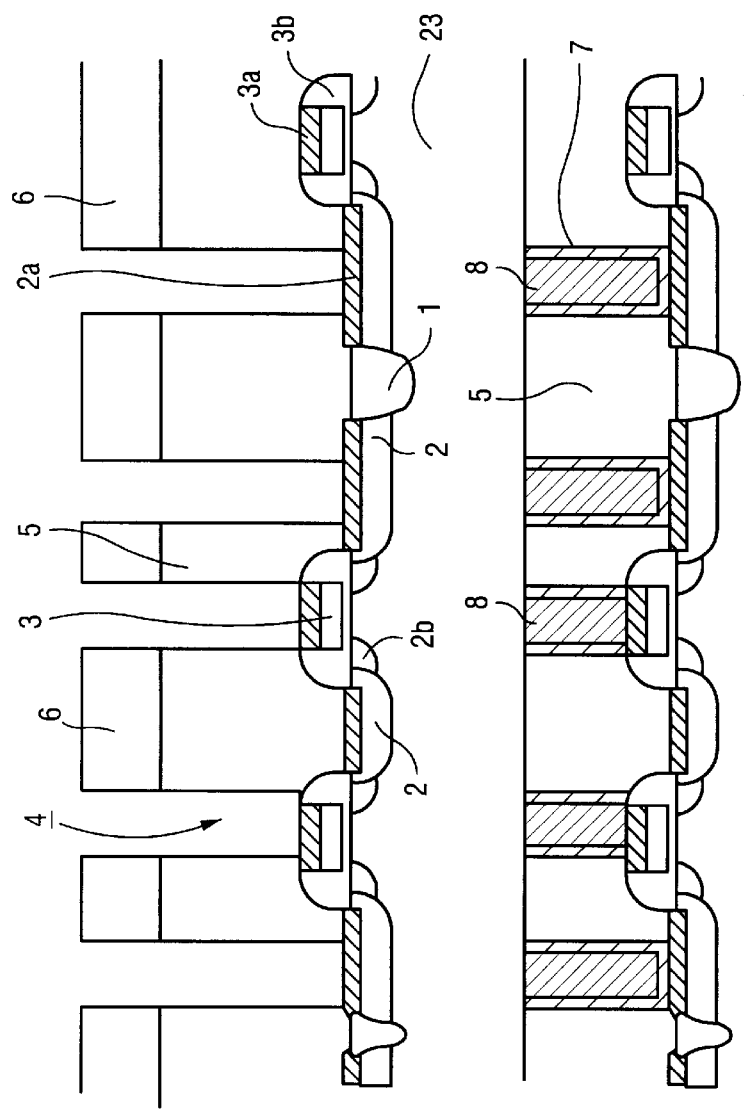
FIGS. 2(a) to 2(g) are each a sectional view showing a method of fabricating a semiconductor device according to the prior art.
Figures 2D, 2E:
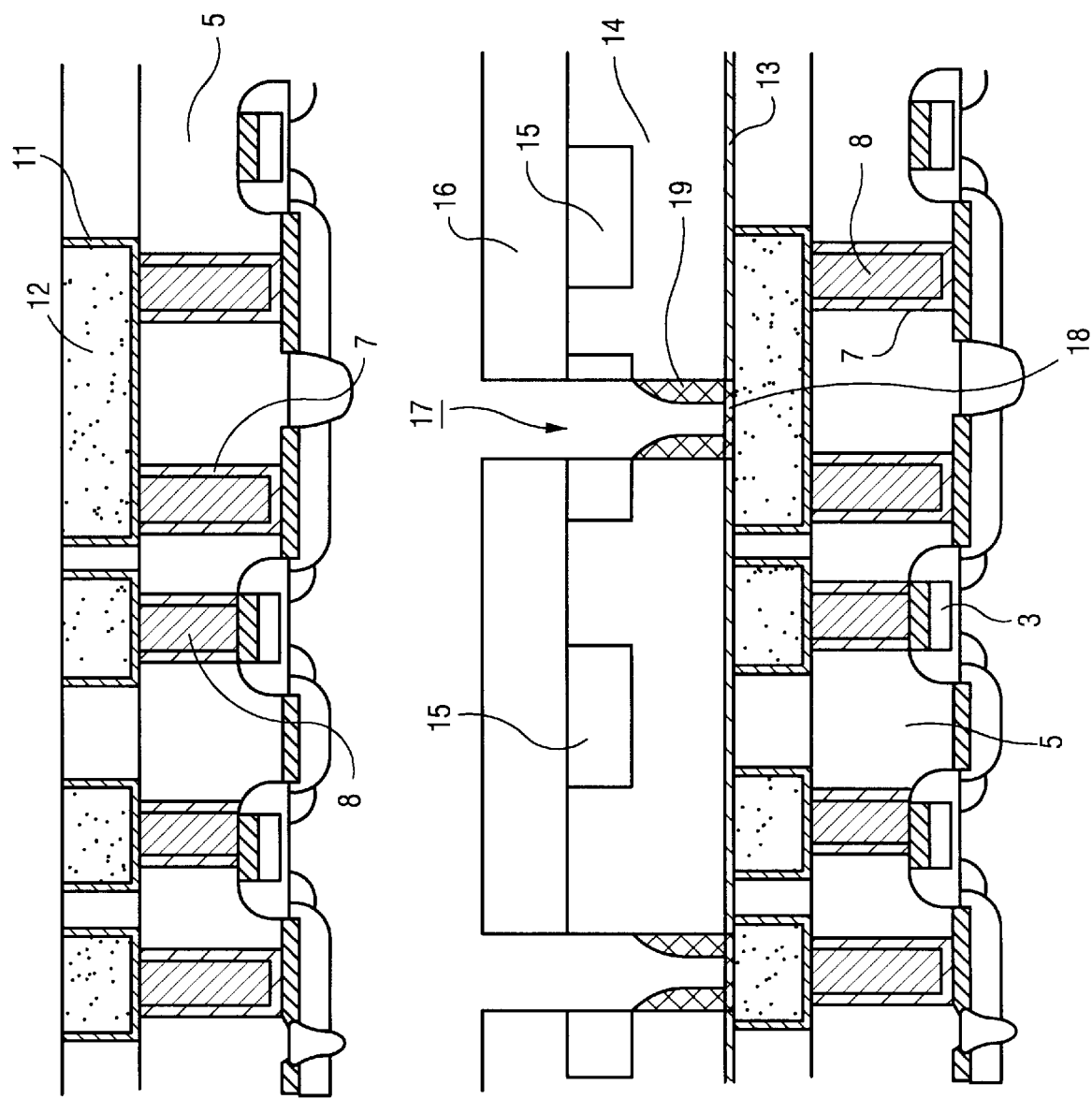
Figure 2F:
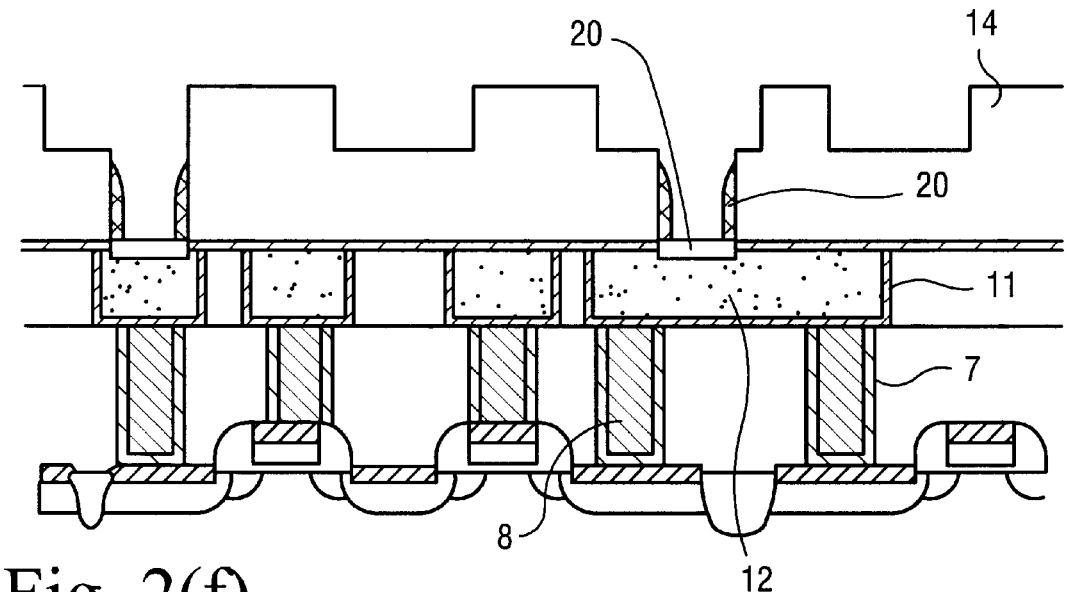
Figure 2G:
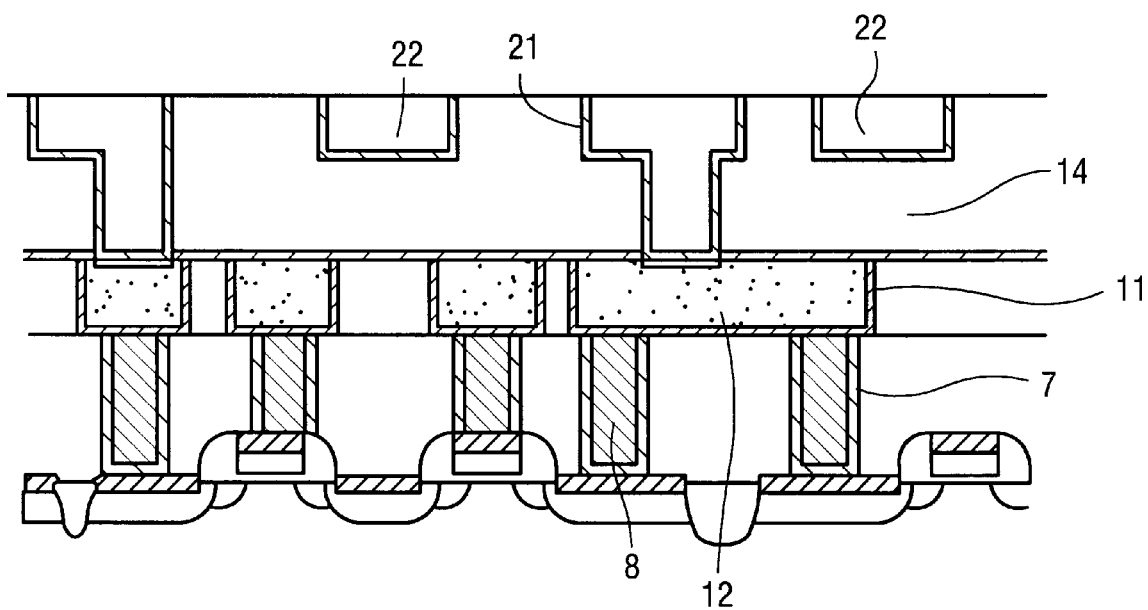

As shown in FIG. 1(h), the barrier metal 21 is deposited by a CVD method or sputtering on the via-holes 17 formed on the Cu wiring in the first tier and on the grooves 15 for wiring. Subsequently, the Cu film 22 is deposited by sputtering, CVD or ECD method, and flattening is conducted by a CMP method so as to leave the barrier metal 21 and the Cu film 22 only in the via-holes 17 and the grooves 15, thereby forming Cu wiring in the second tier.

The method of fabricating a semiconductor device according to the present invention described above can completely remove the copper-containing deposits that adhere to the side walls or the upper portion of the openings, and can also remove completely the high resistance layer that is formed at the bottom of the openings, and can clean the surface of the conductive layer. This method can be used for multi-layered wiring without the problem of increased resistance at the via-holes and in the wiring, wiring delays can be avoided, and the reliability of the wiring maintained, which results in fabrication of a semiconductor device having an extremely high reliability.

The method of fabricating a semiconductor device according to the present invention described above can completely remove the copper-containing deposits that adheres to the side walls or the upper portion of the openings during the formation of the openings, and can also remove completely the high resistance layer that is formed at the bottom of the openings, and can clean the surface of the conductive layer. This method can be used for multi-layered wiring without the danger of increase in the resistance at the via-holes and in the wiring, wiring delays, and the drop in the reliability of the wiring, and can thus be used to fabricate a semiconductor device having extremely high reliability.

What is claimed is:

1. A method of fabricating a semiconductor device comprising the steps of:

forming a conductive layer made of copper or its alloy on a semiconductor substrate;

forming an insulating layer on the conductive layer;

forming an opening in the insulating layer with use of a resist pattern as a mask so as to reach the conductive layer;

subjecting the resulting semiconductor substrate to an oxidizing/ashing treatment in an oxygen plasma atmosphere to remove the resist pattern and to oxidize at least an inner surface of the opening; and washing at least the inner surface of the opening with a solution containing citric acid at normal temperature.

2. A method of fabricating a semiconductor device according to claim 1, wherein the solution containing citric acid is a 10% aqueous solution of a citrate.

3. A method of fabricating a semiconductor device comprising steps of:

forming a conductive layer made of copper or its alloy on a semiconductor substrate;

forming an insulating layer on the conductive layer;

forming an opening in the insulating layer with use of a resist pattern as a mask so as to reach the conductive layer;

removing the resist pattern;

heat-treating the resulting semiconductor substrate in an oxygen atmosphere to oxidize at least an inner surface of the opening; and washing at least the inner surface of the opening with a solution containing citric acid at normal temperature.

* * * * *